(12) United States Patent
Gregorius et al.

(10) Patent No.: US 7,209,004 B2
(45) Date of Patent: Apr. 24, 2007

(54) DB-LINEAR VARIABLE GAIN AMPLIFIER (VGA) STAGE WITH A HIGH BROAD BAND

(75) Inventors: Peter Gregorius, München (DE); Otto Schumacher, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/478,452

(22) PCT Filed: May 21, 2002

(86) PCT No.: PCT/EP02/05579

§ 371 (c)(1),
(2), (4) Date: Jun. 25, 2004

(87) PCT Pub. No.: WO02/095938

PCT Pub. Date: Nov. 28, 2002

(65) Prior Publication Data

US 2004/0239419 A1 Dec. 2, 2004

(30) Foreign Application Priority Data

May 23, 2001 (DE) ................................. 101 25 366

(51) Int. Cl.
*H03F 3/45* (2006.01)
(52) U.S. Cl. ............................. 330/254; 330/86; 330/9
(58) Field of Classification Search ................ 330/254, 330/86, 9
See application file for complete search history.

(56) References Cited

U.S. PATENT DOCUMENTS

| 3,753,140 | A | * | 8/1973 | Feistel ......................... 330/109 |
| 3,953,783 | A | * | 4/1976 | Peters, Jr. ................... 363/124 |
| 4,016,557 | A | | 4/1977 | Zitelli et al. |
| 4,447,747 | A | | 5/1984 | LaPotin |
| 4,543,560 | A | | 9/1985 | Holloway |
| 4,748,393 | A | * | 5/1988 | Fincher et al. .............. 318/638 |
| 5,523,712 | A | * | 6/1996 | Miyabe et al. .............. 327/355 |
| 6,147,558 | A | | 11/2000 | Sculley |
| 6,198,349 | B1 | | 3/2001 | Kanno et al. |
| 6,472,940 | B1 | | 10/2002 | Behzad et al. |
| 6,545,534 | B1 | * | 4/2003 | Mehr .......................... 330/69 |
| 6,570,448 | B1 | * | 5/2003 | Sobel .......................... 330/254 |
| 2003/0054787 | A1 | | 3/2003 | Behzad et al. |

FOREIGN PATENT DOCUMENTS

| DE | 23 22 558 B2 | 7/1978 |
| FR | 2 310 655 A1 | 12/1976 |
| WO | WO 99/53613 | 10/1999 |
| WO | WO 01/35527 A2 | 5/2001 |

* cited by examiner

*Primary Examiner*—Patricia Nguyen
(74) *Attorney, Agent, or Firm*—Maginot, Moore & Beck

(57) ABSTRACT

The invention relates to a VGA stage having a novel circuit configuration for amplifying/attenuating a differential input signal which is transmitted via a transmission line (H). The VGA stage comprises an operational amplifier (OPV1, OPV2), which is connected as shunt feedback, for amplifying the input signal; a string of resistors (R01, R01') for attenuating the signal; and a control device (2) for switching the string of resistors (R01, R01').

16 Claims, 6 Drawing Sheets

DB-LINEAR VARIABLE GAIN AMPLIFIER (VGA) STAGE WITH A HIGH BROAD BAND

The invention relates to a wide-bandwidth VGA stage for amplifying/attenuating especially a differential input signal with a wide dynamic range.

VGA (variable-gain amplifier) stages are used for transforming a variable input signal into an output signal having a fixed amplitude. Modern VGA stages must meet high demands on the linearity of the characteristic and on the bandwidth which can lead to problems especially in the case of input signals having a wide dynamic range (e.g. from 20 mV to 2 V).

In meeting the said criteria, problems arise, in particular, due to the fact that the signals, depending on application, are transmitted via different cable lengths between transmitter and receiver and the input amplifier of the receiver must process signals within a range of e.g. −20 dB to +20 dB amplitude. At the same time, the amplifier must have good linearity and optimum offset and noise behavior. In addition, the input signal must not be loaded significantly by the amplifier. In particular, the input impedance of the amplifier must not significantly change the terminating impedance of the transmission cable since otherwise a mismatch of the line, and thus unwanted reflections/distortions would arise.

To amplify input signals having a wide dynamic range, two concepts are essentially known—fully differential or pseudo differential operational amplifier circuits with resistor networks or transconductance (Gm-over-Gm) stages with variable transconductance.

FIG. 11 shows an example of a fully differential operational amplifier circuit. A signal to be amplified is transmitted via a cable H by means of a driver circuit (transmitter) 3. This signal is present differentially at the input of the VGA stage via the terminating resistor R0. The VGA stage comprises an operational amplifier OPV with (feedback) resistors R1–Rn and R1'–Rn', respectively, which can be switched in or out of circuit via associated switches S and S', respectively. At the output of the VGA stage, a differential output signal is provided at outputs VOUTP and VOUTN, respectively.

These and other known operational amplifiers and transconductance circuits have the following severe disadvantages, among others:

The operational amplifiers used must have a wide bandwidth;

In the case of switchable gain, the channel impedance of the switches S is in series with the (feedback) resistor. This leads to amplification errors and can only be reduced by compensation switches. Since, as a rule, the switches are CMOS transistors, they are greatly dependent on the operating points, temperature and process tolerances. Precise matching is thus not possible;

The input impedance an inverting VGA changes as a function of the connected resistance network. Thus, the resistance value of the parallel circuit of terminating resistance and input resistance changes. A mismatch as a function of the gain set causes additional reflections and distortions;

Rail-to-rail modulation is not possible at the input; and

The offset of series-connected transconductances increases in accordance with the individual gain of the stages. In the case of cascaded transconductance stages, this can lead to overloading at the output end.

VGA stages with transconductances provide the possibility of setting the gain by varying the transconductance (Gm). This can be done by appropriately weighting the supply current, by switching degeneration resistors and by changing the supply voltage in the case of degeneration by means of transistors in the active range. Here, too, a number of serious disadvantages exists:

Switching the supply current requires even better matching of the current mirror transistors. In addition, the operating points of the circuit change and thus correspondingly the dynamic range and the range of linearity and the bandwidth;

In the case of switchable gain by means of switchable degeneration resistors, the switches are arranged in the signal path and must be compensated for;

Transconductances with degeneration by means of transistors in the active range are dependent on the stability of the supply voltage. A variation in the supply voltage leads to a variation in the transconductance;

Transconductances must be kept constant over process and temperature variations. This requires Gm tuning, and thus additional circuit complexity;

The gain error is dependent on the matching of the transconductance stages with respect to one another (Gm-over-Gm).

There is a number of publications in which VGA stages having a relatively high degree of dB linearity and wide-bandwidth are proposed but all of which are based on the said circuit principles and, therefore, have corresponding disadvantages. For example, reference is made to International Patent Application WO 99/53613 discloses a VGA stage which has an operational amplifier with a feedback resistor, formed as a series resistor, for amplifying an input signal Vin and a series resistor, arranged at the input of the VGA stage, for attenuating the input signal, and a control device adjusting or switching the series resistors. The series resistors in each case consist of a series of discrete individual resistors. This has the significant disadvantage that the output characteristic of the VGA stage is distorted and, in particular, is not dB-linear.

U.S. Pat. 6,198,349 B1 discloses a VGA stage according to the preamble of claim 1. Here, too, series resistors with discrete individual resistors are used in the circuit of the operational amplifier.

Hassan O. Elwan, Tuna B. Tarim and M. Ismail, "Digitaly Programmable dB-Linear CMOS AGC for Mixed-Signal Applications", CIRCUITS & DEVICES, July 1998, pages 8ff;

J. J. F. Rijns: "Cmos Low Distortion High-Frequency Variable Gain Amplifier", IEEE-Journal of Solid-State Circuits, Volume 31, No. 7, July 1996, pages 1029ff;

M. Moyal, M. Gröpl, Th. Blon: "A25-kft, 768-kb/s Cmos Analog Front End for Multiple-Bit-Rate DSL Transceiver", IEEE, December 1999; and S. Otaka, G. Takemura and H. Tanimoto: "A Low-Power Low-Noise Accurate Linear-in-dB Variable Gain Amplifier with 500 MHz Bandwidth", IEEE Journal of Solid-State Circuits, Volume 35, No. 12, December 2000, pages 1942ff, and the citations mentioned therein. These known VGA stages, however, have the disadvantages mentioned initially.

It is, therefore, the object of the present invention to create a VGA stage which has a much greater dB linearity and, at the same time, a wide bandwidth.

This object is achieved by the features specified in claim 1. Other embodiments of the invention are the subject matter of subclaims.

The essential inventive performance consists in that a complete departure from familiar circuit concepts was effected and a completely new circuit concept was developed in which, for each half wave of the differential input signal an operational amplifier connected as series/shunt feedback is provided for amplifying the input signal;

a string of resistors is provided for attenuating the signal; and a control device is provided for driving the string of resistors.

The term "string of resistors" is understood to be any series circuits of resistors and equivalent resistor arrangements such as, e.g. strip or layer resistors having a number of taps.

According to an embodiment of the invention, a differential signal is transmitted via a transmission line (Coax or Twisted Pair) which is terminated with a termination resistor. The string of resistors for attenuating the signal is connected in parallel with the terminating resistor.

A second string of resistors is preferably provided which forms the shunt resistance of the operational amplifier and can be switched for adjusting the gain.

The VGA stage can optionally also have a switching device by means of which the first string of resistors can be used, at the same time, as shunt resistance for the operational amplifier.

Where there is a number of strings of resistors, the first string of resistors for attenuating the signal is preferably of identical structure as the second string of resistors.

According to a preferred embodiment, a control device is provided for driving the shunt resistance. Furthermore, the VGA stage according to the invention preferably comprises a control device for switching between the "amplifying" and "attenuating" operating modes.

According to a preferred embodiment, the string of resistors are implemented as strip resistors having a number of taps.

At the output of the VGA stage, a circuit for offset compensation of the output signal of the VGA stage can also be provided.

At a junction between the first string of resistors for the positive and the negative half wave of the signal, a buffer is preferably connected which provides a constant common mode voltage. The buffer is preferably implemented as a voltage follower.

According to a preferred embodiment of the invention, an adjustable stabilization capacitor, which can be varied in dependence on the gain, is provided in the shunt feedback operational amplifier. This has the advantage that the bandwidth of the amplifier can be significantly increased with increasing gain. For this purpose, the stabilizing or Miller capacitance is reduced with increasing gain.

To control the stabilizing capacitance, a corresponding control device is provided.

The invention will be explained in greater detail by way of example in the text which follows, referring to the attached figures, in which.

Figure 8A:
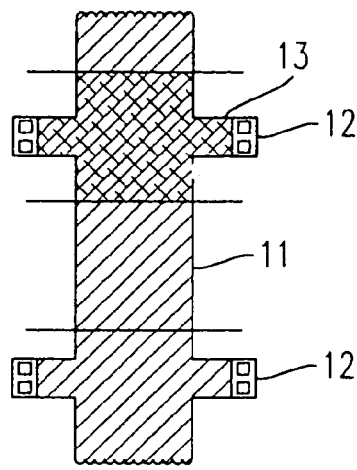
Figure 9:
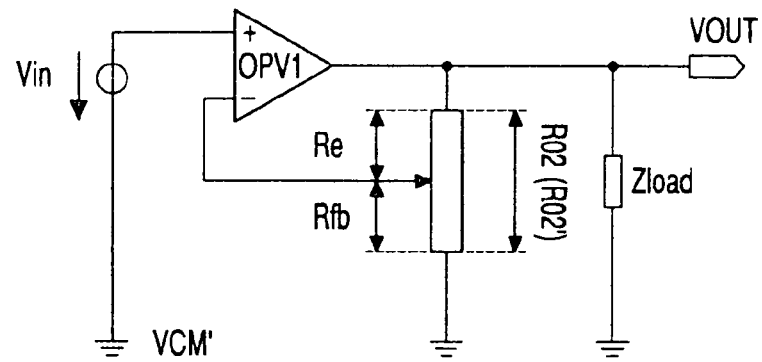
Figure 10:
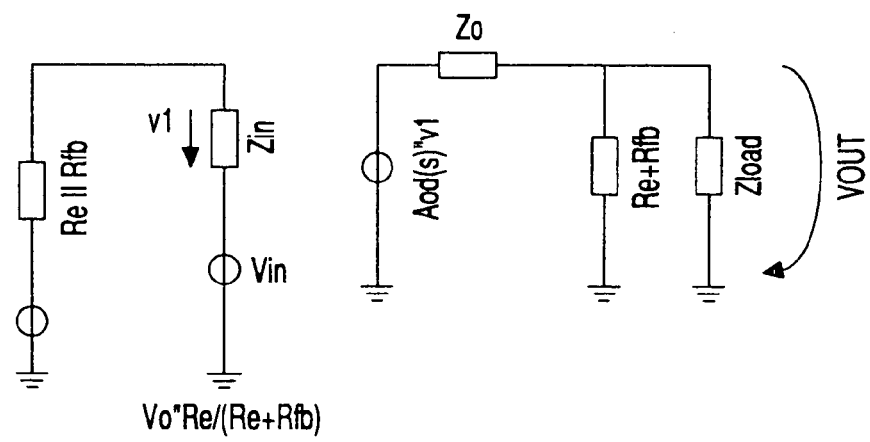
Figure 11:
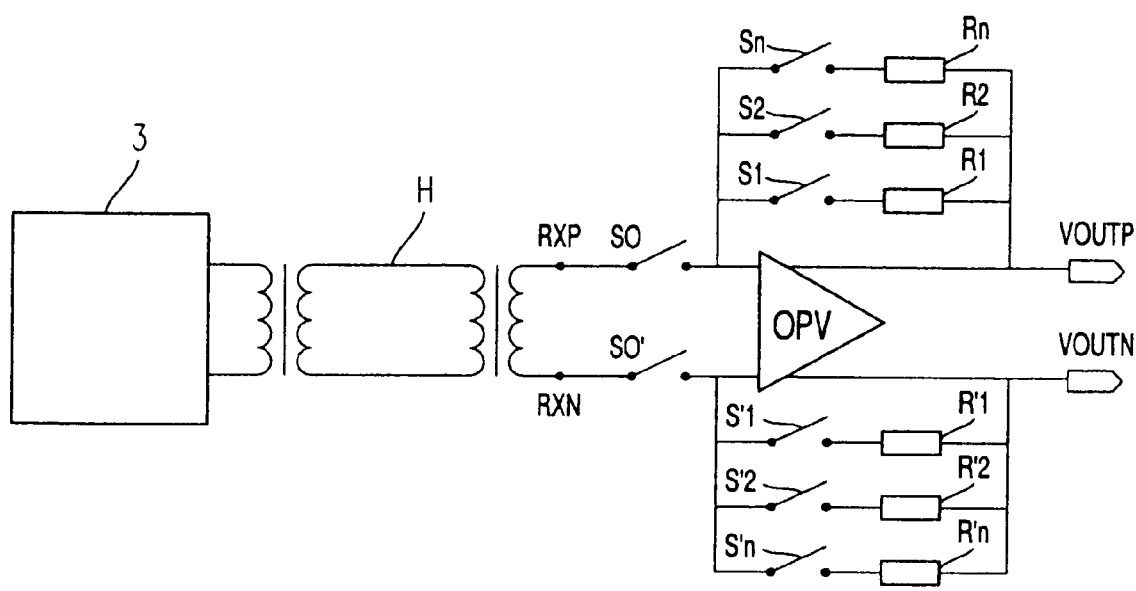

FIGS. 8*a*, *b* show the current flow and the equivalent circuit of a strip resistor;

FIG. 9 shows an amplifier section of a VGA stage for half wave of the input signal;

FIG. 10 shows the small-signal equivalent circuit of the amplifier section of FIG. 9; and FIG. 11 shows a known VGA stage which is constructed of a fully differential operational amplifier circuit.

Figure 1:
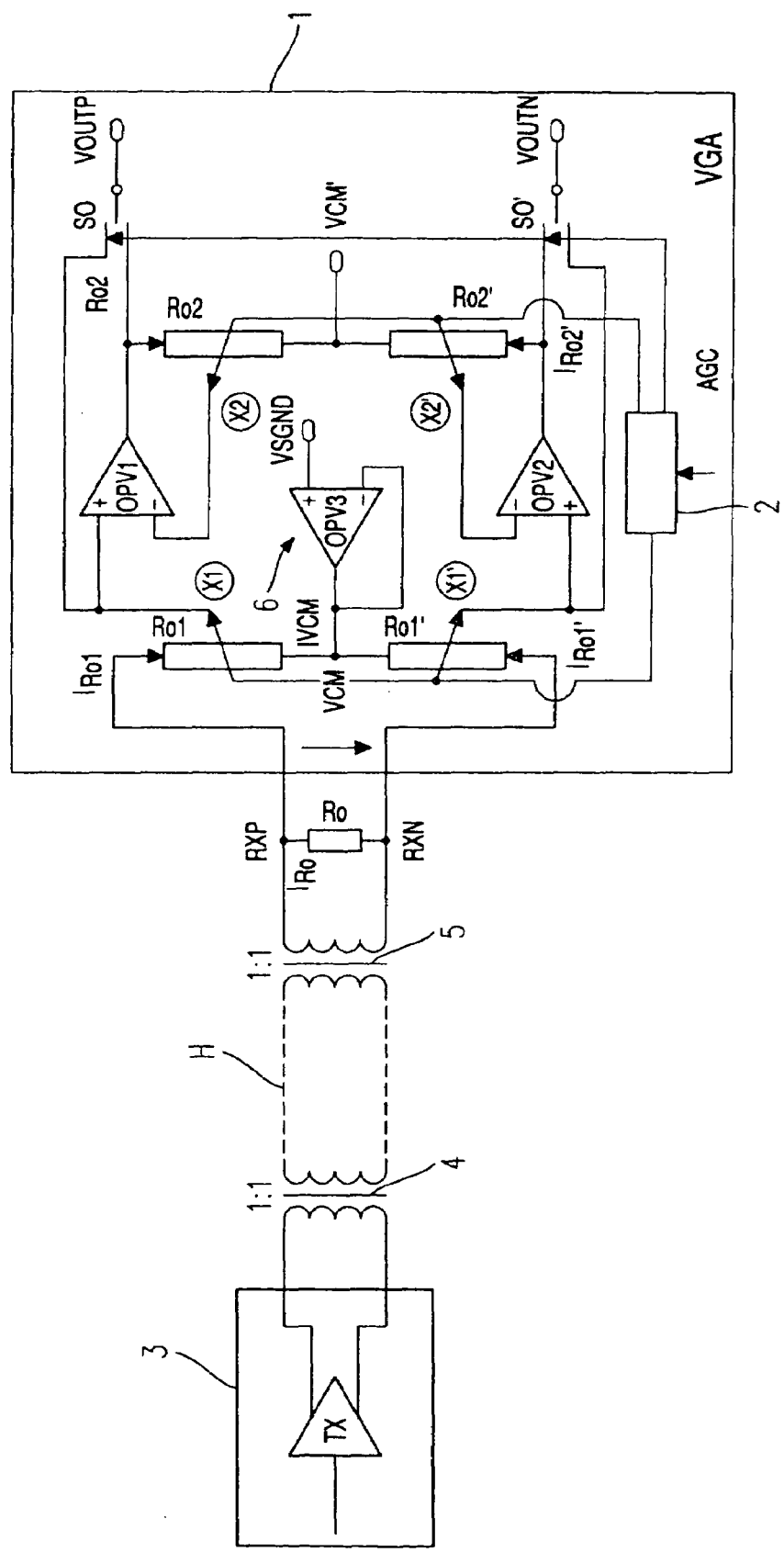
FIG. 1 shows an exemplary embodiment of a VGA stage with operational amplifier connected as series/shunt feedback.

FIG. 1 shows the basic structure of a VGA stage including the signal feed line. The signal to be amplified is transmitted by means of a driver circuit (transmitter) 3 via a cable H (Coax or Twisted Pair). At the interfaces between transmitter/cable and cable/receiver, a transformer 4, 5 is in each case provided. The structure of the VGA stage 1 of the receiver is fully differential and has identical circuit sections for the positive and negative half wave of the input signal.

The VGA stage 1 shown is capable of amplifying or, respectively, attenuating a differential input signal with a wide dynamic range, which fluctuates, e.g. between 20 mV and 2 V, at high linearity and with a wide bandwidth and providing a differential output signal with essentially constant amplitude at the differential outputs VOUTP and VOUTN.

The transmission cable H is terminated non-reflectively by means of a termination resistor. The input signal of the VGA stage is present via the terminating resistor R0. The terminating resistor has a value of between R0=50 Ω to 100 Ω depending on the application. The cable attenuation as a function of signal frequency and cable length can be up to 50 dB. Depending on the data rate, signals within a range of Vsig=70 mV to 3 V must be processed at the input with a variable cable length. The signal provided at the output VOUTP, VOUTN has an amplitude of approx. Uampl=500 mA.

The VGA stage 1 has a string of resistors R01, R01', connected in parallel with the terminating resistor R0, for signal attenuation, an operational amplifier OPV1, OPV2, interconnected as series/shunt feedback, for signal amplification, and a control device for the string of resistors R01, R01'. The said circuit sections are in each case constructed identically for processing the positive and negative half wave of the input signal. A further string of resistors R02, R02' is provided as shunt resistance for the operational amplifiers OPV1, OPV2.

The non-inverted input (+) of the operational amplifier OPV1, OPV2 is connected to a junction X1, X1'. This, in turn, is connected to a tap of the first string of resistors R01, R01'.

The inverted input (−) of the operational amplifier OPV1, OPV2 is connected to a junction X2, X2'. This, in turn, is connected to a tap of the second string of resistors R02 and R02', respectively.

The selection of taps on the string of resistors R01, R01', R02, R02' is controlled by means of a control device 2.

Furthermore, switches S0, S0' are provided by means of which it is possible to switch between an amplifying mode and an attenuating mode. The switches S0, S0' are also controlled by the control device 2 which receives corresponding signals from an AGC.

At the center junction VCM between the two first strings of resistors R01, R01', a buffer 6 implemented as voltage follower is provided which provides a constant common mode voltage.

The center junction VCM between the two first strings of resistors R01, R01' can also be connected to the center junction VCM' between the two second strings of resistors R02, R02' by means of a line.

The potential at the center junction VCM and VCM' is identical, neglecting the offset voltages. The junction VCM' can be used, for example, as signal ground for subsequent stages.

Furthermore, the structure of the strings of resistors R02, R02' is identical to the structure of the first string of resistors R01, R01'. This has the significant advantage that the strings of resistors R01, R01', R02, R02' are optimally matched to one another in layout and thus the influence of offset gradients can be minimized. The strip resistors can be of identical structure even in the case of asymmetric amplification or attenuation.

As mentioned, switches S0, S0' are provided at the output of the VGA stage for switching between the two operating modes of "amplifying" and "attenuating". In the switch position "attenuating" a signal current $I_{R01}$, $I_{R01'}$ flows through the first string of resistors R01, R01'. The signal voltage is present at junction X1 (X1') in accordance with the setting of the string of resistors R01, R01' and is conducted from there directly to the output VOUTP and VOUTN, respectively, of the VGA stage 1. In the switch position "amplifying", the signal voltage Uin is present at the input of the operational amplifier OPV1, OPV2 and is amplified in accordance with the setting of the shunt resistors R02, R02'.

Figure 2:
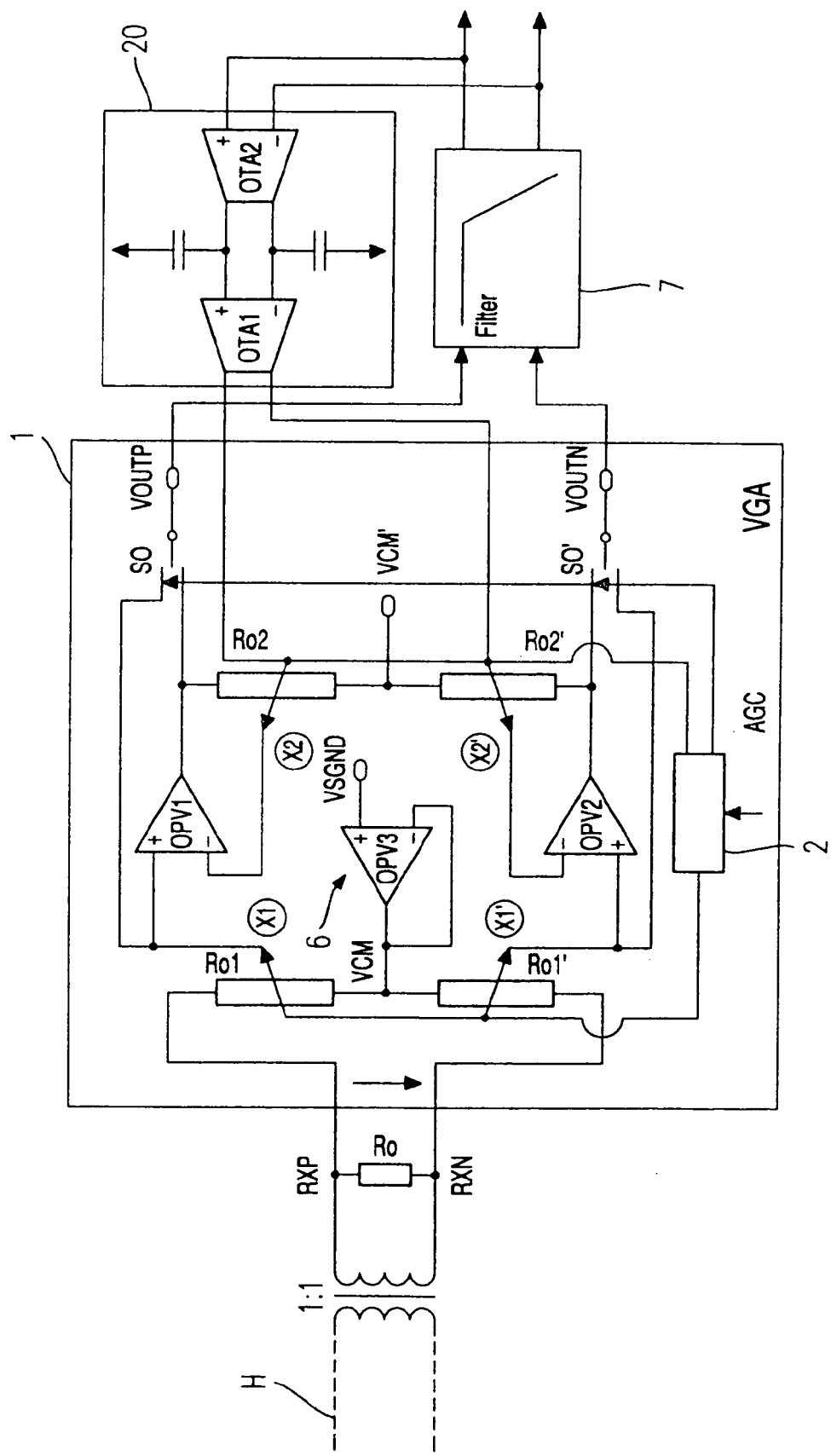
FIG. 2 shows the VGA stage of FIG. 1 with an additional circuit for offset compensation.

As shown in FIG. 2, the junctions X2, X2' can be used for offset compensation. A possible implementation of a feedback circuit 20 for offset compensation is a low-pass circuit consisting of a first transconductance OTA1, a second transconductance OTA2 and two capacitors C1 and C2. The transconductances OTA1, OTA2 are serially connected to one another, the capacitors C1 and C2 in each case being connected to ground from a junction between the transconductances. The outputs of the first transconductance OTA1 are in each case connected to a tap on the second string of resistors R02 and R02'. The inputs of the second transconductance OTA2 are connected to the differential outputs VOUTP, VOUTN of the VGA stage 1. If the VGA stage 1 is followed by a filter circuit 7, the offset correction circuit 20 can also be used for compensating for the offsets caused by this filter. For this purpose, the inputs of the second transconductance OTA2 must be connected to the differential outputs of the filter circuit 7. The filter circuit 7, in turn, is then connected to the differential outputs VOUTP, VOUTN of the VGA stage 1.

The offset correction circuit 20 operates in accordance with the following principle: the offset of the output signal of the VGA stage 1 or of the filter stage 7, respectively is measured by means of the subsequent compensation circuit 20 and is finally compensated for by means of a correction current, the transconductance OTA1 arranged at the output of the offset compensation circuit 20 feeding corresponding correction currents into the junctions X2 and X2'.

When dimensioning the circuit, attention must be paid to the fact that the maximum offset to be expected can be compensated by the circuit and the additional null generated by the offset compensation is located below the lowest spectral component of the signal in the signal path.

Figure 3:
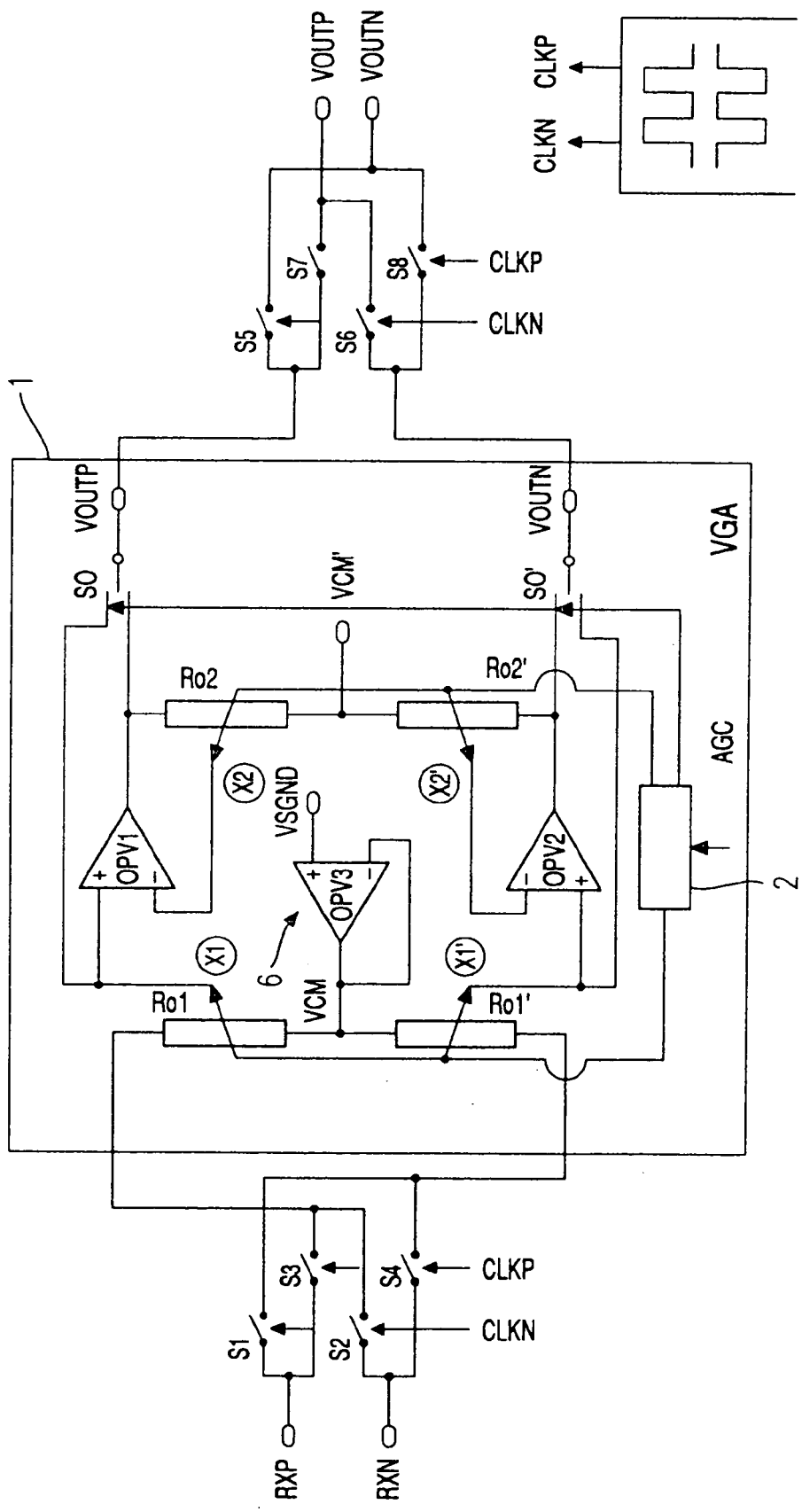
FIG. 3 shows the VGA stage of FIG. 1, which is operated as a chopper.

FIG. 3 shows a further embodiment of an offset compensation circuit 20. The offset compensation circuit comprises switches S1–S4 at the input of the VGA stage 1, and switches S5–S8 at the output of the VGA stage 1. The switches S1–S8 are operated at a chopper frequency, in each case two switches being switched symmetrically. In this configuration, attention must be paid to the fact that the chopper frequency is either far above—taking into consideration the sampling theorem—or far below the signal frequency.

In attenuation mode, the amplifier stage OPV1, OPV2 is simply bypassed in the corresponding position of the switches S0, S0'. This has the advantage that the offset of the amplifier stage OPV1, OPV2 is not located on the signal path in this case.

The strings of resistors R01, R01', R02, R02' are a significant component of the VGA stage since the linearity of the amplification or attenuation significantly depends on its structure. In order to set as dB linear graduation in the gain as possible, it is necessary to dimension the strings of resistors with great precision.

Figure 4:
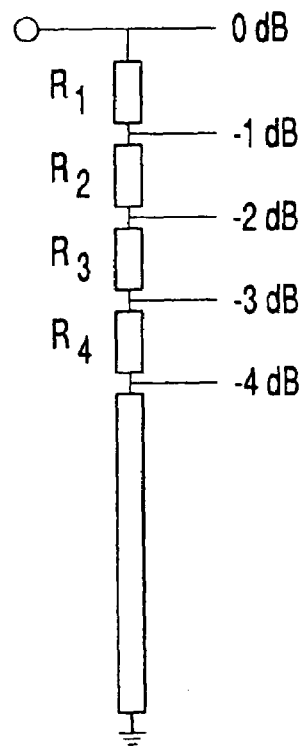
FIG. 4 shows a string of resistors consisting of an arrangement of discrete individual resistors.

Strings of resistors having a number of discrete individual resistors R as shown in FIG. 4 have the basic disadvantage that, due to manufacturing tolerances, precise dimensioning is not possible. As a rule, the individual resistors R of such chains of resistors consist as a rule of polysilicon which is contacted on both sides by a metal contact. At the polysilicon/metal junction, there are parasitic connecting resistances which greatly vary given the current production technologies. At the same time, these connecting resistances form part of the accuracy of the dB-linear graduation.

Figure 5:
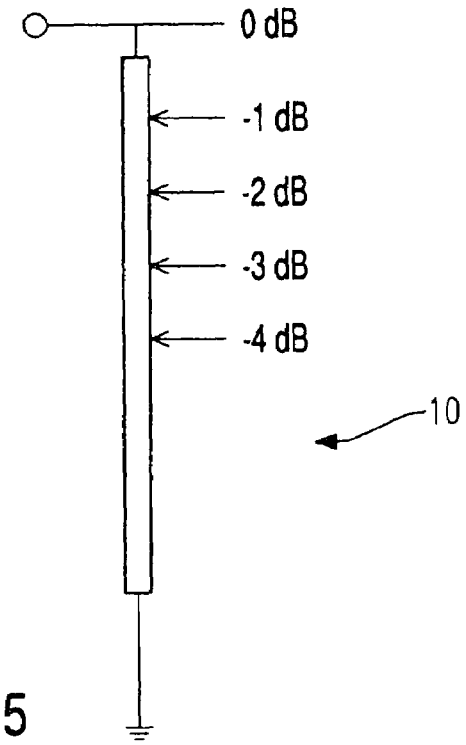
FIG. 5 shows a string of resistors consisting of a strip resistor.

It is, therefore, more advantageous to construct the string of resistors as strip resistor 10 as shown in FIG. 5. In principle, the strip resistor is a single resistor having a number of taps 13. The resistor body 11 consists of a single strip of polysilicon to the side of which symmetric taps 13 are attached. The taps can be terminated with high impedance (pure voltage taps) as a result of which they are no longer in the current path and the problem of greatly differing connecting resistances is circumvented. In this embodiment, the influence of the connecting resistances is negligible.

Figure 6:
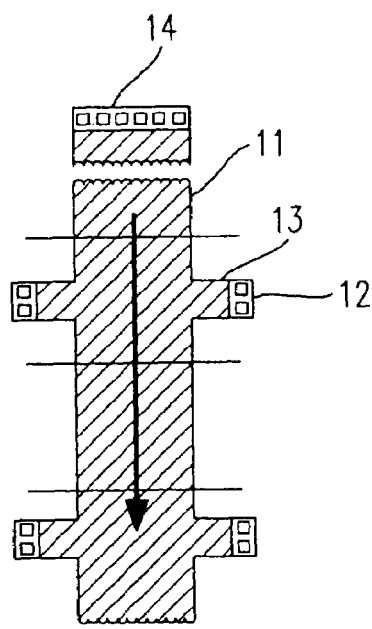
FIG. 6 shows a diagrammatic representation of the structure of a strip resistor.

FIG. 6 shows the structure of a strip resistor 10 in detail. The strip resistor 10 consists of a resistor body 11 having a number of taps 13. The taps 13 are arranged at specific distances on the side of the resistor body 11 and are provided with contacts 12, as are the two ends of the resistor strip 10.

To obtain a resistance divider having taps 13 in dB-linear steps, the individual resistance values can be calculated in a simple manner. If k $\epsilon(0,-1,\ldots,-n)$ are the amplification steps 0 dB, -1 dB, ..., -ndB and k $\epsilon(0,-1,\ldots,-n+1)$ are the pieces of resistance between the taps k=k and k=k-1, the following taps are obtained:

$$\frac{u_k}{u_c} = \frac{r_{ges} - r_k}{r_{ges}} = k \text{ dB}$$

$$r_k = r_{ges}(1 - 10^{\frac{k}{20}})$$

$$\Delta r_k = r_{ges}(10^{\frac{k}{20}} - 10^{\frac{k-1}{20}})$$

Figure 7:
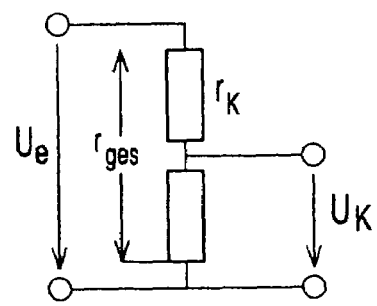
FIG. 7 shows an equivalent circuit for calculating the taps of the strip resistor of FIG. 6.

The meaning of the individual quantities r, u is obtained from FIG. 7 which shows the equivalent circuit of a strip resistor 10.

The resistance values $r_K$ obtained must be converted into physical distances between the taps 13. Using the sheet resistance $R_\square$ and a predetermined width w, the nominal distances 1 between the taps can be calculated as follows:

$$l_{k,num} = \Delta r_k \frac{w}{R_\square},$$

It must also be taken into consideration that the taps locally change the resistance per unit length of the strip resistor. This is because the current lines are "bent" outward around the connections 13 as is shown in FIG. 8*a*. This increases the effective width of the resistor strip and the total resistance thus becomes smaller. The following applies:

$$r = \int_{x=0}^{l} \frac{R_\square}{w(x)}$$

Taking into consideration this effect, the resistance $R_a$ can be calculated for a piece of strip with tap 13. The length of this section must be selected in such a manner that the tap 13 no longer has a significant influence on the current lines I. Similarly, the projections or lugs of taps 13 must be made long enough so that the current lines only flow through areas having a defined resistance per unit length. The adapted resistance between the taps can then be calculated as follows:

$$l_k = (\Delta r_k - R_a) \frac{w}{R_\square} + l_a$$

Figure 8B:
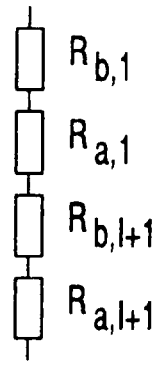

FIG. 8*b* shows an equivalent circuit of the strip resistor 10 with taps 13 where resistances $R_b$ correspond to the part resistances in areas without taps 13 and resistances $R_a$ correspond to the part resistances in areas with taps 13. Taking into consideration the equations for calculating the resistor strips, the relative error between an ideal resistor strip and a real one can be calculated, the following holding true:

$$\varepsilon(k) = \frac{1 - r(k) - \frac{(1 - n*\varepsilon R) - (r(k) + k*\varepsilon R)}{1 - n*\varepsilon R}}{\frac{(1 - n*\varepsilon R) - (r(k) + k*\varepsilon R)}{1 - n*\varepsilon R}}$$

As already mentioned, the sum of the resistances R01 and R01' is parallel to the terminating resistor R0. If no signal is present at junctions RXP and RXN, no current flows through the resistors R0 and R01, R01'. The potential at the junction between the resistors R01, R01' thus becomes the common mode voltage VCM.

If a differential signal is present at junctions RXP to RXN, a compensating current correspondingly flows through R0 and R01, R01'. The resistors R01 and R01' should be selected to have such values that the total resistance from the parallel circuit is determined by R0.

The total resistance is calculated in approximation as $$R0 \| (R01 + R01') \quad [1.1]$$

If the total resistance from the parallel circuit of R0 to R01, R01' is for example to lead to a maximum deviation of less than 1% of R0, the following relation must be maintained:

$$R0 \| (R01 + R01') \geq (1 - 1\%)*R0 \Rightarrow \quad [1.2]$$

$$(R01 + R01') \geq \frac{(1 - 1\%)*R0^2}{R0 - (1 - 1\%)*R0}$$

The current $I_{R01}$ and $I_{R01'}$ through resistors R01 and R01' is thus smaller by a factor of 99 than the current $I_{R0}$ through resistor R0. Resistors R02 and R02' provide the same values as R01 and R01'. The dimensioning of the resistors also provides the requirements for the common mode voltage VCM and the buffer OPV3.

With an ideal differential drive, the current $I_{VCM}=0$. In the case of non-ideal differential drive, the common mode voltage should vary only insignificantly with a maximum current $I_{R01}$ and $I_{R01'}$, and a corresponding signal frequency. This provides the source impedance for the output and the required bandwidth of the buffer OPV3.

FIG. 9 shows the amplifier section of VGA stage 1 for a half wave. The small-signal equivalent circuit of the arrangement is shown in FIG. 10. From the equivalent circuit, the mathematical relationships for the input impedance, output impedance and the transfer function can be derived. The input impedance of the amplifier arrangement is obtained as:

$$Z_{in} = \left( Z_{iopv} + \frac{R_c * R_{fb}}{R_c + R_{fb}} \right) * (1 + a(s) * f) \quad [1.3]$$

$$a(s) = \frac{Z_{iopv}}{Z_{iopv} + \frac{R_c * R_{fb}}{R_c + R_{fb}}} * A_{opv}(s) * \frac{\frac{Z_{load} * (R_c + R_{fb})}{Z_{load} + R_c + R_{fb}}}{\frac{Z_{load} * (R_c + R_{fb})}{Z_{load} + R_c + R_{fb}} + Z_a} \quad [1.4]$$

$$f = \frac{R_c}{R_c + R_{fb}} \quad [1.5]$$

$$R_c = R_{02} * (1 - x) \quad [1.6]$$

$$R_{fb} = R_{02} * x \quad [1.7]$$

where
$Z_{IN}$ is the input impedance of the amplifier arrangement
$Z_{IOPV}$ is the input impedance OPV1/2
$R_c$, $R_{fb}$ are feedback resistors
A(s) is the open-loop gain of the series/shunt feedback OPV
F is the feedback factor
$Z_{LOAD}$ is the load impedance and
$A_{opv}(s)$ is the open-loop gain of OPV1 and OPV2.

Assuming that the OPV is a 2-stage amplifier, the transfer function within the frequency range for the open-loop gain can be specified in a simplified manner as a function with two pole positions and one null. The following applies:

$$A_{opv}(s) = \frac{A_{vodc} * (1 - s/\omega_{z1})}{(1 - s/\omega_{p1}) * (1 - s/\omega_{p2})} \quad [1.8]$$

$z_1$ is the frequency at the nulls
$\omega_{p1}$, $\omega_{p2}$ are the pole frequencies and
$A_{vodc}$ is the DC open-loop gain of the OPV.

This results in a total transfer function of the amplifier arrangement as:

$$A_C(s) = \frac{\left(\frac{Z_{iopv}}{Z_{iopv} + \frac{R_c * R_{fb}}{R_c + R_{fb}}} * A_{opv}(s) * \frac{\frac{Z_{load} * (R_c + R_{fb})}{Z_{load} + R_c + R_{fb}}}{\frac{Z_{load} * (R_c + R_{fb})}{Z_{load} + R_c + R_{fb}} + Z_o}\right)}{1 + \left(\frac{Z_{iopv}}{Z_{iopv} + \frac{R_c * R_{fb}}{R_c + R_{fb}}} * A_{opv}(s) * \frac{\frac{Z_{load} * (R_c + R_{fb})}{Z_{load} + R_c + R_{fb}}}{\frac{Z_{load} * (R_c + R_{fb})}{Z_{load} + R_c + R_{fb}} + Z_o}\right) *} \left(\frac{R_c}{R_c + R_{fb}}\right) \quad [1.9]$$

Taking into consideration equation 1.3, it can be seen that the input impedance of the receiver is obtained as follows:

$$Z_{iopv} = Z_0 \| (2*R_{01}) \| (2*Z_i) \quad [1.10]$$

Simplifying Rfb=0 Ω and f→0hz, equation 1.3 is obtained as follows:

$$Z_{in} \cong Z_{iopv} * (1 + A_{ovdc}) \quad [1.11]$$

Since the input impedance of the OPV stage in CMOS technology can be assumed to lie within the range of Ziopv>>100 kΩ, it is found that the influence of the amplifier circuit on the total input impedance of the VGA is only small. Thus, there is no additional loading of the source or change in the effective terminating impedance. This minimizes mismatching and thus unwanted distortion and reflection. This is an essential requirement for the circuit.

Thus, the input impedance of the configuration can be represented as follows, taking into consideration equation 1.2:

$$Z_{inex} = Z_0 \| (2*R_{01}); Z_{in} >> Z_0, R_{01} \quad [1.12]$$

A further requirement for the circuit is that the necessary gain is achieved with one stage. The gain-bandwidth product is normally constant.

$$f_t \cong \frac{|A_{ovdc}| * \omega_{p1}}{2 * \pi} \quad [1.13]$$

Using equation 1.8 as a basis, the null $\omega_{z1}$~$C_c$ and the pole positions $\omega_{p1}$, $\omega_{p2}$ are also ~$C_c$ with Miller compensation of the OPV. As the gain increases, this means that the bandwidth of the series/shunt feedback configuration decreases. The bandwidth is essentially determined by the null and pole positions of the OPV. The stability of the OPV is determined by the distance between the two pole frequencies $\omega_{p1}$, $\omega_{p2}$. The stability is given with $\omega_{p2}>>10*\omega_{p1}$. To guarantee the bandwidth of the configuration over all gain settings, the Miller or frequency response compensation capacity is correspondingly adapted by means of the control device 2 in dependence on the gain. As the gain increases, the Miller capacity is reduced and conversely. With respect to the dimensioning, attention must be paid to guaranteeing the stability at maximum gain and with a given load.

The advantage of this type of bandwidth boosting consists in that the current consumption of the amplifier is not increased and the switching-on and -off of the compensation can be graduated directly from the decoding circuit without additional complexity.

LIST OF REFERENCE DESIGNATIONS

1 VGA stage
2 Control device
3 Transmitter
4,5 Transformers
6 Buffer
7 Filter
10 Strip resistor
11 Resistor body
12 Contact
13 Tap
14 Contact
20 Circuit for offset compensation
OPV1, OPV2 Series/shunt feedback amplifier
R01, R01' First strings of resistors
R02, R02' Second strings of resistors
OPV3 Voltage follower
VOUTN, VOUTP Differential outputs
RXP, RXN Differential inputs
X1, X1' Junctions
X2, X2' Junctions
VCM, VCM' Common mode voltage
R0 Terminating resistor
CLKN, CLKP Clock
OTA1, OTA2 Transconductance
S0–S8 Switches
C1, C2 Capacitors

The invention claimed is:

1. A wide band variable gain amplifier (VGA) stage for amplifying or attenuating an input signal that is transmitted via a transmission line (H) comprising:
   an operational amplifier for amplifying the input signal;
   a feedback resistor connected to said operational amplifier and formed as a first series strip resistor having a first number of taps;
   an input resistor arranged at an input of the VGA stage for attenuating the input signal and formed as a second series strip resistor having a second number of taps; and
   a control device for switching said feedback resistor and said input resistor;
   wherein said operational amplifier comprises a first operational amp portion for a positive half wave of the input signal and a second operational amp portion for a negative half wave of the input signal;
   said feedback resistor comprises a first feedback resistor portion connected to said first operational amplifier portion and a second feedback resistor portion connected to said second operational amplifier portion; and
   said input resistor comprises a first input resistor portion connected to an input of said first operational amplifier portion and a second input resistor portion connected to an input of said second operational amplifier.

2. A wide band variable gain amplifier (VGA) stage for amplifying or attenuating an input signal that is transmitted via a transmission line (H) comprising:
   an operational amplifier for amplifying the input signal;
   a feedback resistor connected to said operational amplifier and formed as a first series strip resistor having a first number of taps;
   an input resistor arranged at an input of the VGA stage for attenuating the input signal and formed as a second series strip resistor having a second number of taps, wherein said second series strip resistor is arranged in parallel with a terminating resistor terminating the transmission line;

a control device for switching said feedback resistor and said input resistor; and a switching device operative to utilize said input resistor as a second feedback resistor for said operational amplifier.

3. A wide band variable gain amplifier (VGA) stage for amplifying or attenuating an input signal that is transmitted via a transmission line (H) comprising:

an operational amplifier for amplifying the input signal;

a feedback resistor connected to said operational amplifier and formed as a first series strip resistor having a first number of taps;

an input resistor arranged at an input of the VGA stage for attenuating the input signal and formed as a second series strip resistor having a second number of taps, wherein said second series strip resistor is arranged in parallel with a terminating resistor terminating the transmission line, wherein said first series strip resistor and said second series strip resistor are structurally identical; and a control device for switching said feedback resistor and said input resistor.

4. The VGA of claim 2, wherein said control device is further operative to switch between an attenuation mode of operation and an amplifying mode of operation.

5. The VGA of claim 2, further comprising a compensating circuit operative to compensate for offset of an output signal of the VGA.

6. The VGA of claim 5, wherein said compensation circuit is additionally operative to compensate for offset of one or more filter stages coupled to the VGA stage.

7. The VGA stage of claim 1, further comprising a buffer coupled at a junction between said first input resistor portion and said second input resistor portion, said buffer providing a constant common mode voltage.

8. The VGA stage of claim 7, wherein said buffer comprises a voltage follower.

9. The VGA stage of claim 2, wherein said operational amplifier includes a stabilizing capacitance that can be varied in dependence on gain.

10. The VGA stage of claim 9, wherein said stabilizing capacitance is reduced with increasing gain.

11. The VGA stage of claim 9, further comprising a stabilizing capacitance control device operative to control said stabilizing capacitance.

12. The VGA stage of claim 2, wherein said first number of taps and said second number of taps are terminated with a high impedance.

13. A receiver for digital signal transmission, said receiver comprising:

a signal input configured to receive an input signal;

a signal output;

an operational amplifier for amplifying the input signal;

a feedback resistor connected to said operational amplifier and formed as a first series strip resistor having a first number of taps;

an input resistor arranged at an input of a VGA stage for attenuating the input signal and formed as a second series strip resistor having a second number of taps; and a control device for switching said feedback resistor and said input resistor;

wherein said operational amplifier comprises a first operational amp portion for a positive half wave of the input signal and a second operational amp portion for a negative half wave of the input signal;

said feedback resistor comprises a first feedback resistor portion connected to said first operational amplifier portion and a second feedback resistor portion connected to said second operational amplifier portion; and said input resistor comprises a first input resistor portion connected to an input of said first operational amplifier portion and a second input resistor portion connected to an input of said second operational amplifier.

14. The receiver of claim 13, further comprising a switching device operative to utilize said input resistor as a second feedback resistor for said operational amplifier.

15. The receiver of claim 13, wherein said first series strip resistor and said second series strip resistor are structurally identical.

16. The receiver of claim 13, further comprising a compensating circuit operative to compensate for offset of an output signal of the VGA stage.

* * * * *